United States Patent [19]
Wong et al.

[11] Patent Number: 5,426,376
[45] Date of Patent: Jun. 20, 1995

[54] NOISE ISOLATED I/O BUFFER THAT USES TWO SEPARATE POWER SUPPLIES

[75] Inventors: Jeffrey F. Wong, Fremont; Derwin W. Mattos, Santa Clara; James D. Shiffer, II, Fremont, all of Calif.

[73] Assignee: VLSI Technology, Inc., San Jose, Calif.

[21] Appl. No.: 52,442

[22] Filed: Apr. 23, 1993

[51] Int. Cl.$^6$ .......................................... H03K 17/16
[52] U.S. Cl. ........................................ 326/27; 326/83
[58] Field of Search ............... 307/443, 451, 473, 475, 307/579

[56] References Cited

U.S. PATENT DOCUMENTS

| | | | |
|---|---|---|---|
| 4,504,747 | 3/1985 | Smith et al. | 307/475 |
| 4,731,553 | 3/1988 | Van Lehn et al. | 307/443 |
| 4,749,882 | 6/1988 | Morgan | 307/451 |
| 4,758,743 | 7/1988 | Dehganpour et al. | 307/443 |
| 4,779,013 | 10/1988 | Tanaka | 307/443 |
| 4,785,201 | 11/1988 | Martinez | 307/443 |
| 4,789,796 | 12/1988 | Foss | 307/443 |
| 4,797,579 | 1/1989 | Lewis | 307/443 |
| 4,800,298 | 1/1989 | Yu et al. | 307/443 |
| 4,806,794 | 2/1989 | Walters, Jr. | 307/451 |
| 4,818,901 | 4/1989 | Young et al. | 307/451 |
| 4,820,942 | 4/1989 | Chan | 307/443 |
| 4,823,029 | 4/1989 | Gabara et al. | 307/443 |
| 4,825,099 | 4/1989 | Barton | 307/270 |
| 4,825,101 | 4/1989 | Walters, Jr. | 307/270 |
| 4,825,102 | 4/1989 | Iwasawa et al. | 307/443 |
| 4,827,159 | 5/1989 | Naganuma | 307/443 |
| 4,829,199 | 5/1989 | Prater | 307/443 |
| 4,855,623 | 8/1989 | Flaherty | 307/473 |
| 4,857,770 | 8/1989 | Partovi et al. | 307/451 |
| 4,877,980 | 10/1989 | Kubinec | 307/443 |
| 4,928,023 | 5/1990 | Marshall | 307/451 |
| 5,057,711 | 10/1991 | Lee et al. | 307/473 |
| 5,063,308 | 11/1991 | Borkar | 307/451 |
| 5,296,757 | 3/1994 | Koizumi | 307/475 |
| 5,319,260 | 6/1994 | Wanlass | 307/451 |
| 5,332,932 | 7/1994 | Runaldue | 307/443 |

FOREIGN PATENT DOCUMENTS

| | | | |
|---|---|---|---|
| 0509489 | 10/1992 | European Pat. Off. | H03K 19/003 |
| 0533340 | 3/1993 | European Pat. Off. | G06F 13/40 |

Primary Examiner—Edward P. Westin
Assistant Examiner—Benjamin D. Driscoll
Attorney, Agent, or Firm—Burns, Doane, Swecker & Mathis

[57] ABSTRACT

An I/O buffer is provided that is noise-isolated, i.e., less susceptible to the effect of switching noise. In particular, a noise isolated I/O buffer includes an output terminal, a transient switching circuit connected to first power and ground voltage sources, to a logic input signal and to the output terminal, and a logic holding circuit connected to second power and ground voltage sources separate from the first power ground voltage sources, to the logic input signal and to the output terminal. The transient switching circuit causes a logic level of the output terminal to be switched responsive to a change in the input signal. The logic holding circuit causes the logic level of the output terminal to be maintained in the absence of a change in the input signal. In the absence of a change in the input signal, the transient switching circuit may be turned off, therefore presenting a high impedance to the first power and ground voltage sources. Switching noise in the first power supply network therefore is not transmitted through to the outputs of unswitched I/O buffers. The transient switching circuit and the logic holding circuit may be connected to the same power and ground voltage sources. The transient switching circuit, however, is turned off in the absence of a change in the input signal, and the logic holding circuit is turned off responsive to a change in the input signal. Smaller current surges are therefore provided at different times rather than a single large current surge, thereby reducing dI/dt.

4 Claims, 9 Drawing Sheets

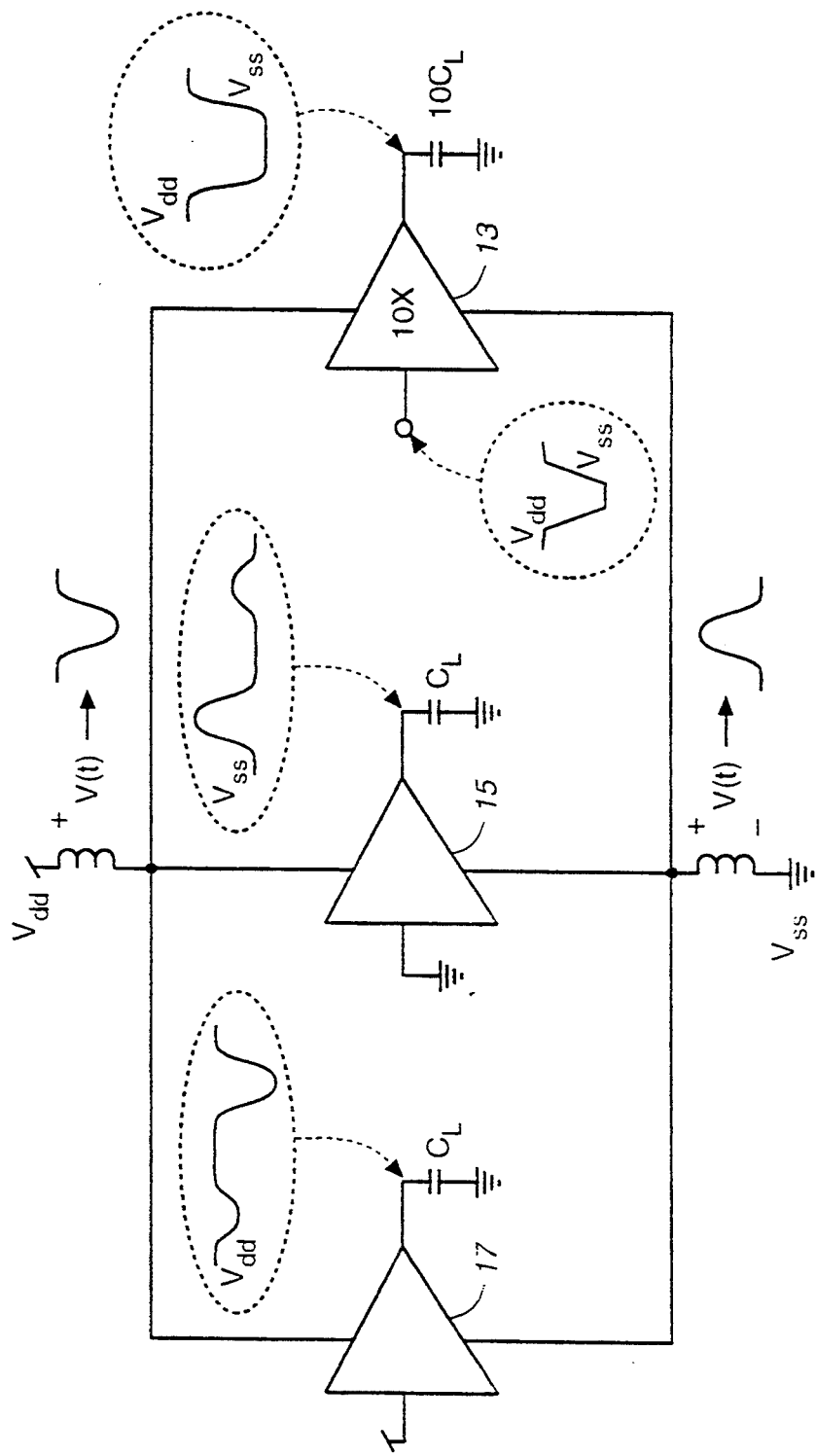
FIG._1

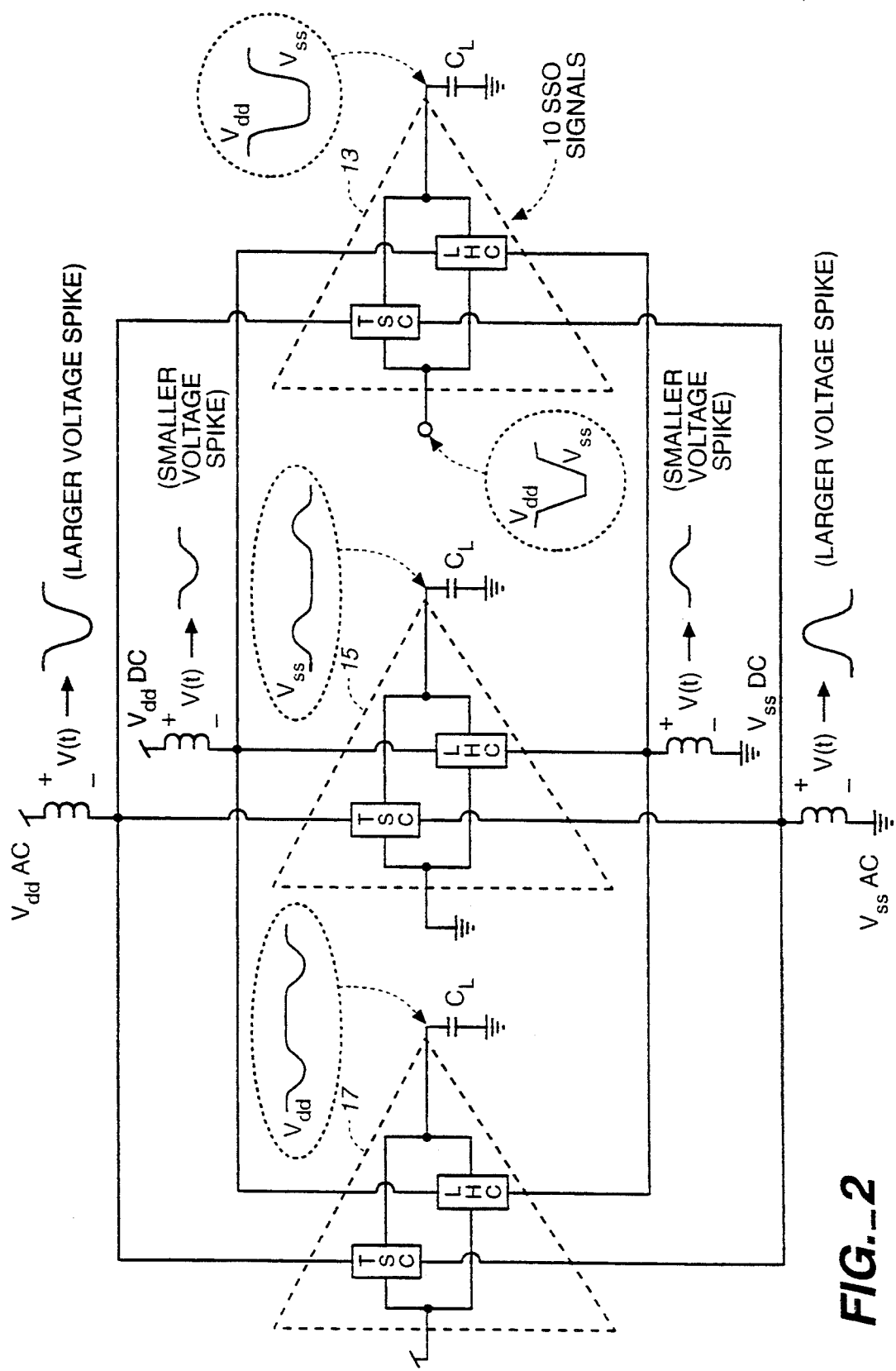
FIG._2

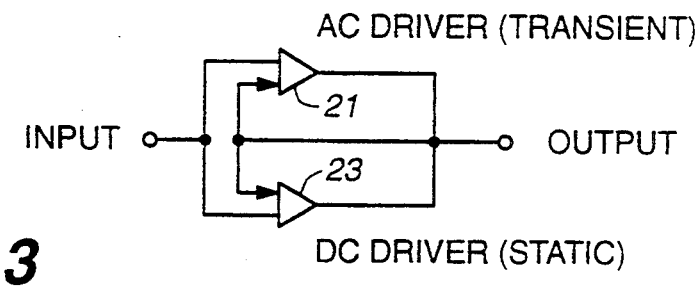
FIG._3
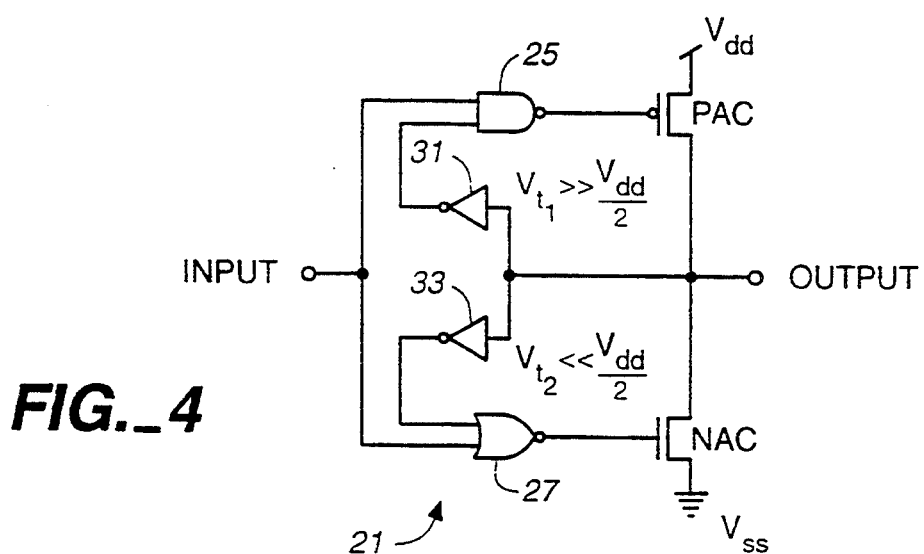
FIG._4
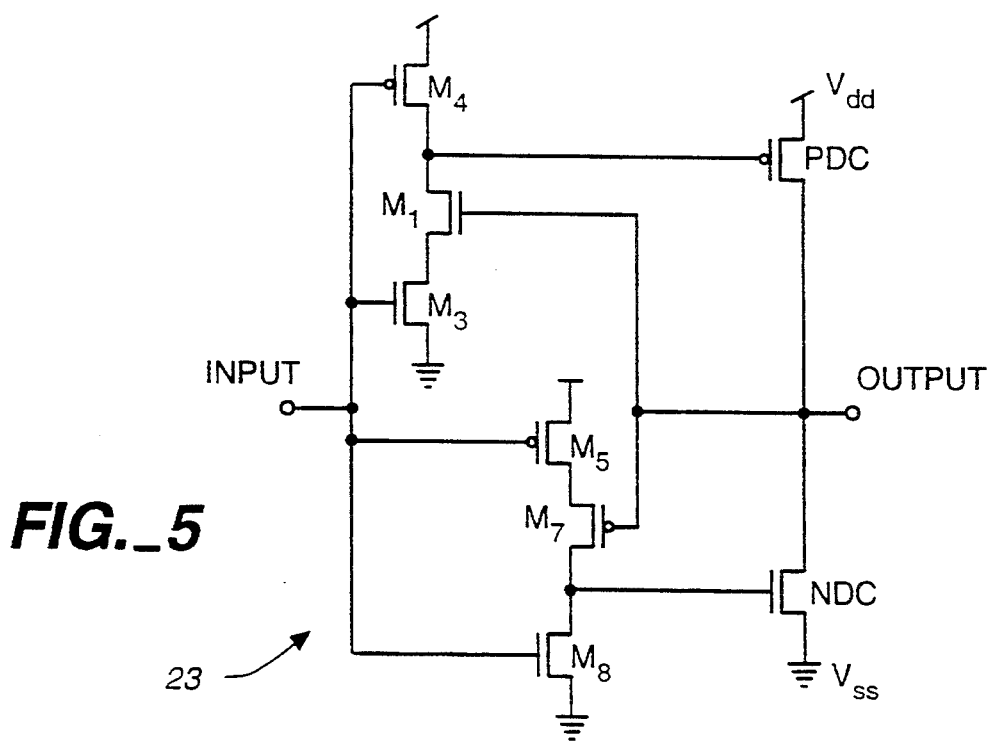
FIG._5

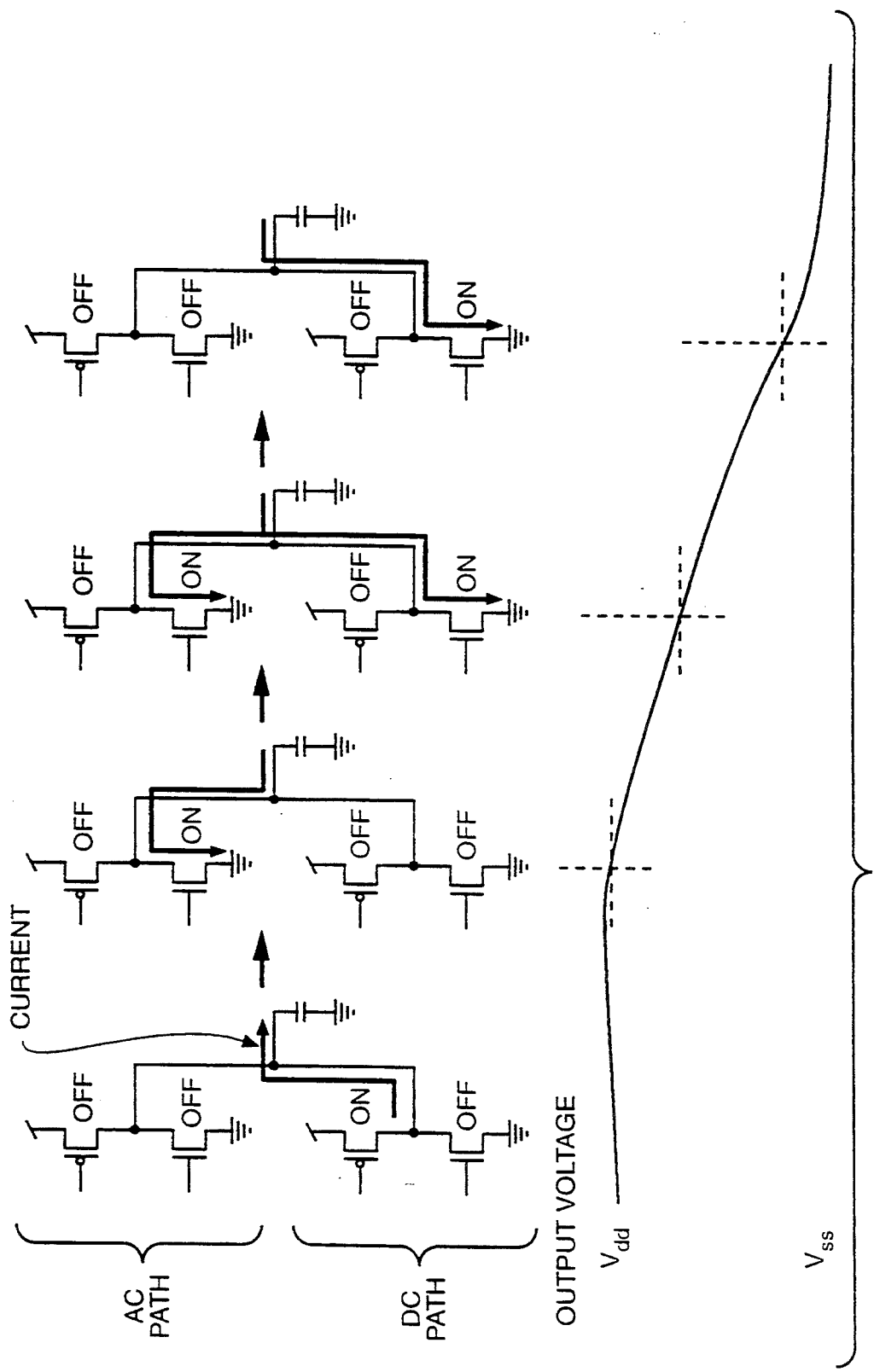
FIG._6

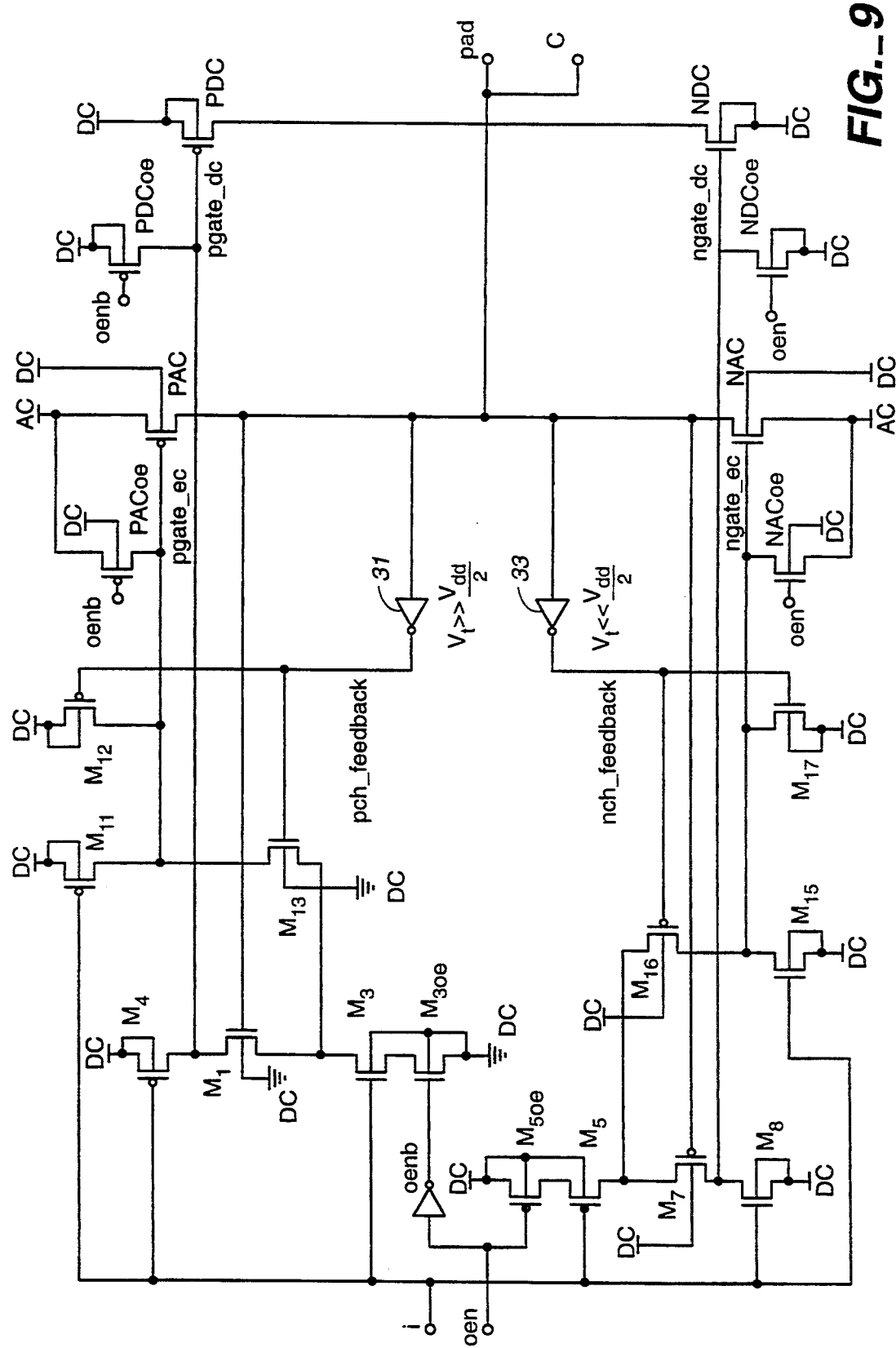
FIG._9

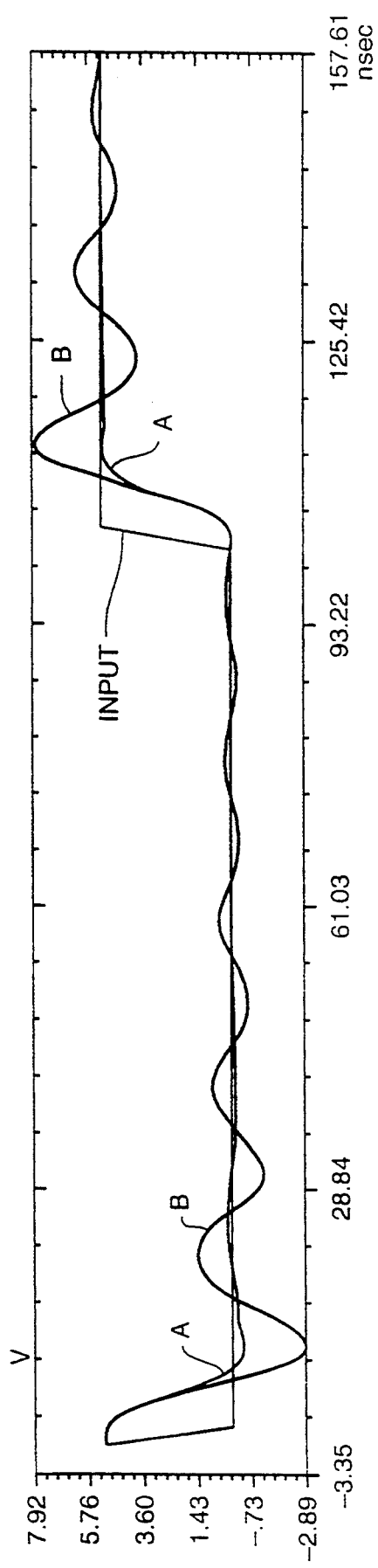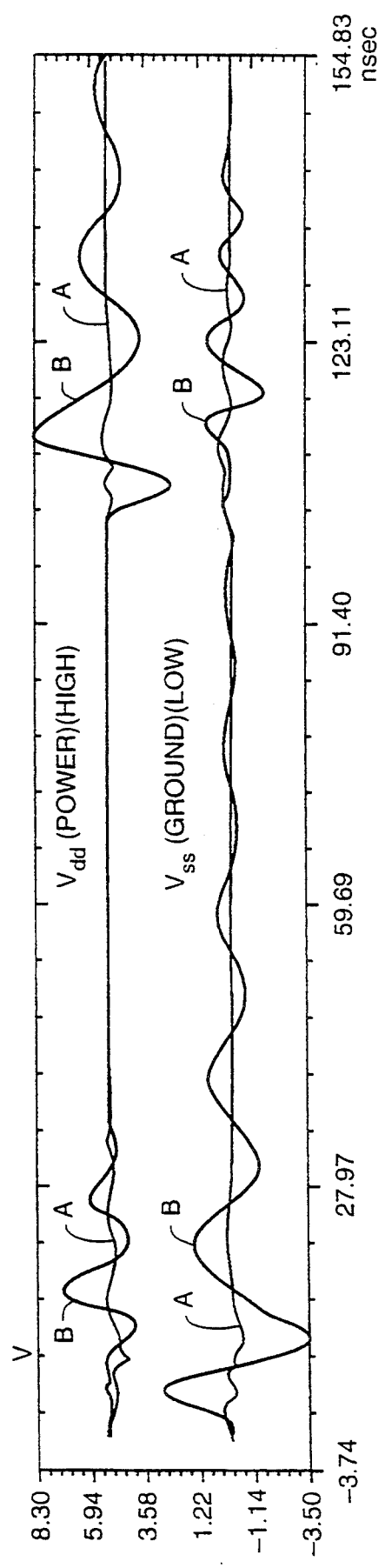

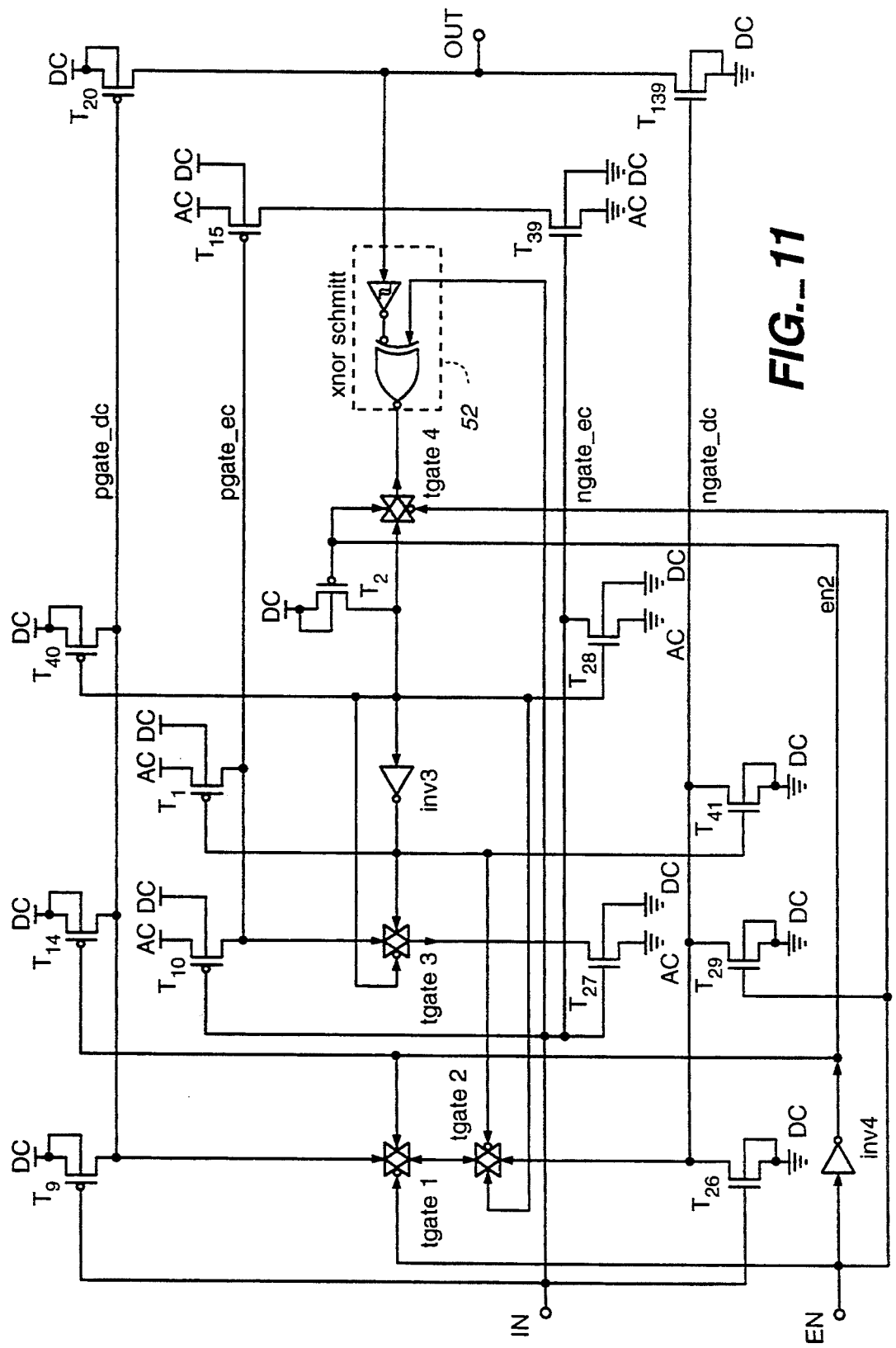
FIG._11

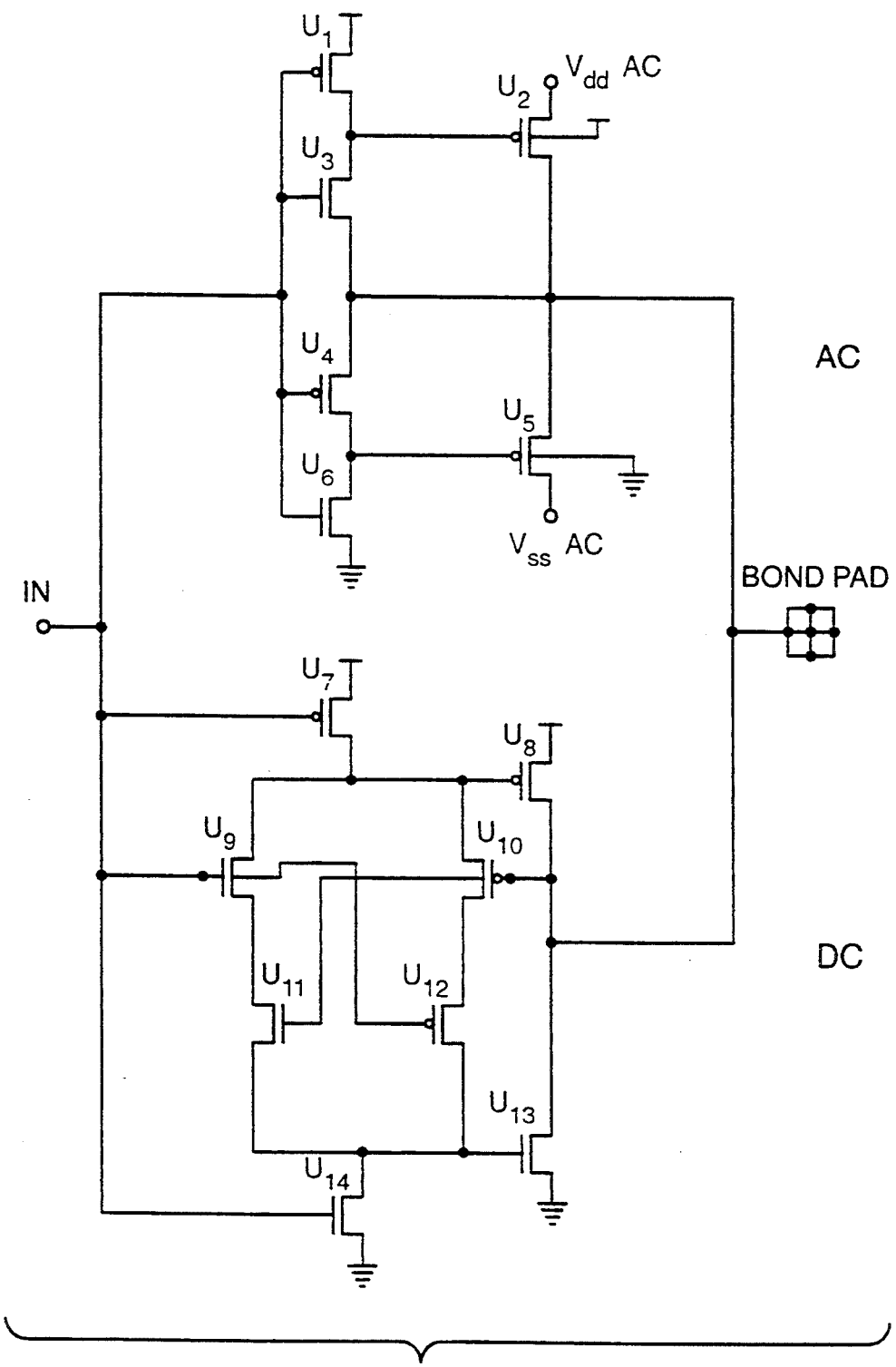
FIG._12

NOISE ISOLATED I/O BUFFER THAT USES TWO SEPARATE POWER SUPPLIES

BACKGROUND OF THE INVENTION

1. Field of the Invention

The present invention relates to integrated circuit input/output (I/O) buffers, and more particularly to techniques for minimizing the effects of switching noise on such buffers.

2. State of the Art

The high speeds now possible with integrated circuits have made switching noise and power supply stability important considerations. Because of the high speeds of I/O buffers and the large loads they drive, noise from simultaneously switching output buffers (SSOs) has a large effect on power supply stability. Power and ground lines in an integrated circuit have associated with them distributed inductances that may be modeled as lumped inductors. During switching of an output buffer from low to high, current is sourced through a power lead and its associated inductance at a changing rate. Change in current through an inductor produces a voltage across the inductor. Accordingly, "voltage droop" occurs in which the supply voltage falls below the nominal supply voltage for a period of time before recovering. Similarly, during a high to low transition, "ground bounce" occurs in which the ground voltage rises above the nominal ground voltage for a period of time before recovering.

Voltage droop and ground bounce are both the result of voltage spikes on the power network caused by logic transitions. Such voltage spikes have two adverse consequences. Because they reduce the operating voltage, voltage spikes delay circuit operation. More importantly, voltage spikes may be transmitted through to the output of I/O buffers whose outputs are not being switched and should remain stable, therefore resulting in erroneous switching. The transmitted voltage spikes are therefore manifested as switching noise.

The foregoing problem becomes particularly acute in the case of a large number simultaneously switching I/O buffers. In FIG. 1, for example, the buffer 13 represents ten simultaneously switching I/O buffers undergoing a high to low transition. Also connected to the power network are other unswitched I/O buffers, represented by the unswitched I/O buffer 15 whose output is low and the unswitched I/O buffer 17 whose output is high. When the ten simultaneously switching I/O buffers switch from high to low, a large current flows through the ground lead with its associated inductance to ground, producing on the ground lead a large voltage spike. This voltage spike is transmitted through to the outputs of the unswitched I/O buffers and may cause erroneous transitions to be observed by the circuit connected to these I/O buffers. The I/O buffer 15 with its static low output is particularly affected by the described high-to-low transition, whereas the I/O buffer 17 with its static high output is particularly affected by a low-to-high transition.

One possible solution to the problem of switching noise is to reduce power and ground pin inductance, for example by adding additional power and ground pins to the power network. This measure, however, leaves fewer pins available as I/O pins. Another alternative is to use a more expensive package, an option that may not be economically feasible or attractive.

Other possible solutions to the problem of switching noise are designed to reduce the rate of change of current through the power and ground pin inductances. U.S. Pat. No. 4,825,102 describes an output driver in which switching of the driving devices is controlled such that one turns off before the other conducts current. This limits the "crowbar" current that flows from $V_{dd}$ to $V_{ss}$, during switching. U.S. Pat. No. 4,827,159 describes an output driver that uses inverters with different switching thresholds to control switching of the driving devices. U.S. Pat. No. 4,825,099 describes the use of feedback and RC delays to limit the rise and fall time of driver-controlling signals. In particular, feedback is used to control the current available to charge up the driver's gate. U.S. Pat. No. 4,928,199 discloses an output driver that provides for many smaller current surges at different times using simple control circuitry. U.S. Pat. No. 4,925,101 discloses an output driver that uses a source follower to provide an extra current source. None of these prior solutions, however, is entirely satisfactory.

SUMMARY OF THE INVENTION

The present invention, generally speaking, provides for an I/O buffer that is noise-isolated, i.e., less susceptible to the effects of switching noise. In particular, a noise isolated I/O buffer in accordance with the invention includes an output terminal, a transient switching circuit connected to first power and ground voltage sources, to a logic input signal and to the output terminal, and a logic holding circuit connected to second power and ground voltage sources separate from the first power ground voltage sources, to the logic input signal and to the output terminal. The transient switching circuit causes a logic level of the output terminal to be switched responsive to a change in the input signal. The logic holding circuit causes the logic level of the output terminal to be maintained in the absence of a change in the input signal. In the absence of a change in the input signal, the transient switching circuit may be turned off, therefore presenting a high impedance to the first power and ground voltage sources. Switching noise in the first power supply network therefore is not transmitted through to the outputs of unswitched I/O buffers.

In accordance with another embodiment of the present invention, the transient switching circuit and the logic holding circuit may be connected to the same power and ground voltage sources. The transient switching circuit, however, is turned off in the absence of a change in the input signal, and the logic holding circuit is turned off responsive to a change in the input signal. Smaller current surges are therefore provided at different times rather than a single large current surge, thereby reducing dI/dt.

BRIEF DESCRIPTION OF THE DRAWINGS

The present invention may be further understood from the following written description in conjunction with the appended drawings. In the drawings:

FIG. 1 is a diagram illustrating a cause and effect of switching noise;

FIG. 2 is a corresponding diagram illustrating a cause of switching noise and a reduced effect of switching noise in accordance with the present invention;

FIG. 3 is a simplified schematic diagram of an I/O buffer circuit in accordance with the present invention;

FIG. 4 is a simplified schematic diagram of the AC driver portion of the I/O buffer circuit of FIG. 3;

FIG. 5 is a simplified schematic diagram of the DC driver portion of the I/O buffer circuit of FIG. 3;

FIG. 6 is a diagram illustrating the action of output drivers for both the AC and DC sections during a high to low transition;

FIG. 9 is a schematic diagram of another embodiment of the I/O buffer circuit of the present invention;

FIGS. 10A and 10B are waveform diagrams of operation of the circuit of FIG. 8 during a falling output transition;

FIG. 11 is a schematic diagram of another embodiment of the I/O buffer circuit of the present invention; and FIG. 12 is a schematic diagram of a further embodiment of the I/O buffer circuit of the present invention.

DETAILED DESCRIPTION OF THE PREFERRED EMBODIMENTS

Figure 7:
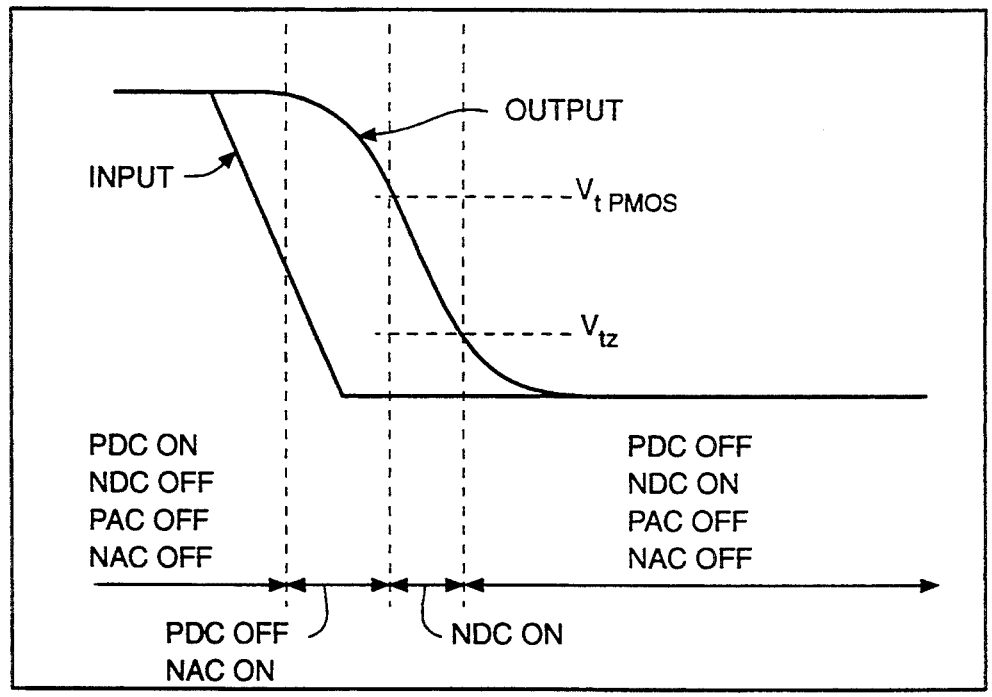
FIG. 7 is a waveform diagram illustrating the states of driver transistors during the failing output transition of FIG. 6.

Referring now to FIG. 2, noise isolation of I/O buffers is achieved by providing within each I/O buffer two separate drivers having separate power and ground networks, an AC driver, or Transient Switching Circuit (TSC), and a DC driver, or Logic Holding Circuit (LHC). The transient switching circuit and the logic holding circuit are connected in common to the input signal and the output terminal of each respective I/O buffer. The transient switching circuit is operative from a time just after the occurrence of a transition on the input signal of the I/O buffer to a time just prior to when the rail voltage is reached. The logic holding circuit is operative from a time just prior to when the transient switching circuit turns off to a time at which a subsequent logic transition occurs at the input signal. The operational phases of the transient switching circuit and the logic holding circuit are therefore largely non-overlapping.

Typically, the current sourced or sunk by the transient switching circuit is much greater (and changes at a greater rate) than the current sourced or sunk by the logic holding circuit. As a result, whereas a significant voltage spike is produced on the power lead or ground lead of the transient switching circuits, a comparatively small voltage spike is produced during switching on the power lead or ground lead connected to the logic holding circuits. The logic holding circuits' source of $V_{DD}$ (LHC $V_{DD}$) and the logic holding circuit ground (LHC ground) are therefore referred to as "quiet power" and "quiet ground", respectively, as compared to the transient switching circuit source of $V_{DD}$ (TSC $V_{DD}$) and the transient switching circuit ground (TSC ground).

A MOSFET is constructed by forming two separated wells of one conduction type in a substrate of another conduction type. One of the wells is connected to the source electrode of the device and the other of the wells is connected to the drain electrode. The region separating the two wells forms the channel. The gate electrode is formed above the channel on top of an insulating layer. The substrate of the one conduction type and the two wells of the opposite conduction type form two parasitic diodes from the substrate to the drain and source electrodes, respectively. The substrate is typically connected to power or ground so that a gate voltage referenced to power or ground may be applied to the gate electrode, forming a field in the channel region. Because of the parasitic diodes, power or ground noise may be transmitted to the drain or source electrode of the device. By connecting the substrates of all devices in both the transient switching circuit and the logic holding circuit of FIG. 2 to quiet ground, the I/O buffers are rendered less susceptible to switching noise of the noisy TSC ground. As seen in FIG. 2, although the outputs of the unswitched I/O buffers experience some switching noise upon the occurrence of falling and rising transitions at the output of the ten simultaneous I/O buffers, the noise is greatly reduced as compared to the voltage spike that is transmitted through to the outputs of the unswitched I/O buffers in FIG. 1.

Referring now to FIG. 3, the transient switching circuit of FIG. 2 may be regarded as an AC driver, and the logic holding circuit may be regarded as a DC driver, the AC and DC drivers (21,23) being connected as shown. An input signal is connected to both drivers, and both drivers are connected to a common output. That output is fed back to form a second input to both drivers. The different operational phases of the AC driver and the DC driver are controlled by the relative voltages of the input and output signals.

A simplified version of one possible embodiment of the AC driver 21 is shown in greater detail in FIG. 4. The driver includes driver transistors PAC and NAC and associated logic circuitry, including a NAND gate 25, a NOR gate 27 and two inverters 31 and 33. The input signal is connected to both the NAND gate 25 and the NOR gate 27. The output signal produced by the inverting buffer is input to the NAND gate 25 through one of the inverters (31) and to the NOR gate 27 through the other of the inverters (33). The threshold voltage $V_{t1}$ of the inverter 31 is set considerably higher than $V_{DD}/2$ and the threshold voltage $V_{t2}$ of the inverter 33 is set considerably lower than $V_{DD}/2$. As a result, in the case of a rising transition, as the output approaches $V_{DD}$ and passes through the threshold voltage $V_{t1}$, the AC driver 21 ceases to source current to the output. In the case of a falling transition, as the output approaches $V_{SS}$ and passes through the voltage $V_{t2}$, the AC driver 21 ceases to sink current. In both cases, as the transient response nears it conclusion, the AC driver 21 shuts off. Shutting off the AC driver at the appropriate time is important in order to minimize switching noise without incurring a speed penalty. If the AC driver were to not shut off, noise could be transmitted through the AC driver to its output. If the AC driver shuts off too soon, switching delay time is prolonged. If the AC driver shuts off too late, output ringing results.

The DC driver 23 is shown in greater detail in FIG. 5. Output driving transistors PDC and NDC produce the output signal and are controlled by logic that receives as inputs both the input signal and the output signal. The Transistor PDC is allowed to turn on only when the input a signal and the output signal are both high, in which case both transistors M1 and M3 conduct, applying a low voltage to the gate of the transistor. Otherwise, the gate of transistor PDC is connected to a high voltage through transistor M4. The Transistor NDC is allowed to turn on only when the input signal and the output signal are both low, in which case transistors M5 and M7 both conduct, applying a high voltage to the gate of the transistor. Otherwise, the gate of transistor NAC is connected to a low voltage through transistor M8. During transient operation the DC driver 23 is therefore shut off. By turning the DC driver on only when the output voltage is near the rail voltage, the DC driver can be made sufficiently strong to pull the output voltage to the rail voltage quickly without producing an undesirable amount of noise.

The manner of interaction of the AC and the DC drivers may be seen in FIG. 6, showing the action of output drivers for both the AC and DC sections during a high to low transition. Initially, the output voltage is maintained high by the DC driver. When a transition occurs in the input signal, the DC driver turns off while the AC driver turns on and begins sinking current such that the output voltage beings to drop. As the output voltage drops, it reaches a voltage threshold defining a logic low, at which time the DC driver turns on. Because the low voltage feedback threshold $V_{f2}$ in the AC driver is lower than the DC feedback voltage threshold $V_{tPMOS}$, the AC driver continues to also sink current. For a period of time, the AC driver and the DC driver are therefore both on at the same time. As the output voltage continues to drop and reaches the low voltage feedback threshold $V_{f2}$, the AC driver turns off. The DC driver remains on in order to maintain the output voltage at a low logic level.

The same manner of operation for a falling output transition is represented in FIG. 7 in terms of the states of the driver transistors of the AC and DC drivers. As seen previously in FIGS. 4 and 5, the DC driver includes a p-type driver transistor, PDC, and an n-type driver transistor, NDC. Likewise, the AC driver includes a p-type transistor driver, PAC, and an n-type transistor driver, NAC. Initially, the input signal is at $V_{DD}$. At this time, the driver transistor PDC is on and the rest of the driver transistors are off. The input signal then undergoes a transition to $V_{ss}$. During the transition, the input signal reaches a logic low threshold level. At this time, the transistor M3 turns off and the transistor M4 turns on, such that the driver transistor PDC turns off. The NOR gate 27 of the AC driver receives a logic zero from the input signal and a logic zero from the inverted output signal, which is still high, therefore producing a logic high signal that turns the driver transistor NAC on. As a result, the output signal begins to transition, a with the transition of the output signal lagging the transition of the input signal. When the output signal reaches a logic zero voltage threshold, the control logic of the DC driver determines that the input and output signal are both low, and the driver transistor NDC turns on and remains on. The driver transistor NDC remains on until the output signal reaches the lower voltage threshold $V_{f2}$, at which time it turns off, leaving only the driver transistor NDC turned on.

Figure 8:
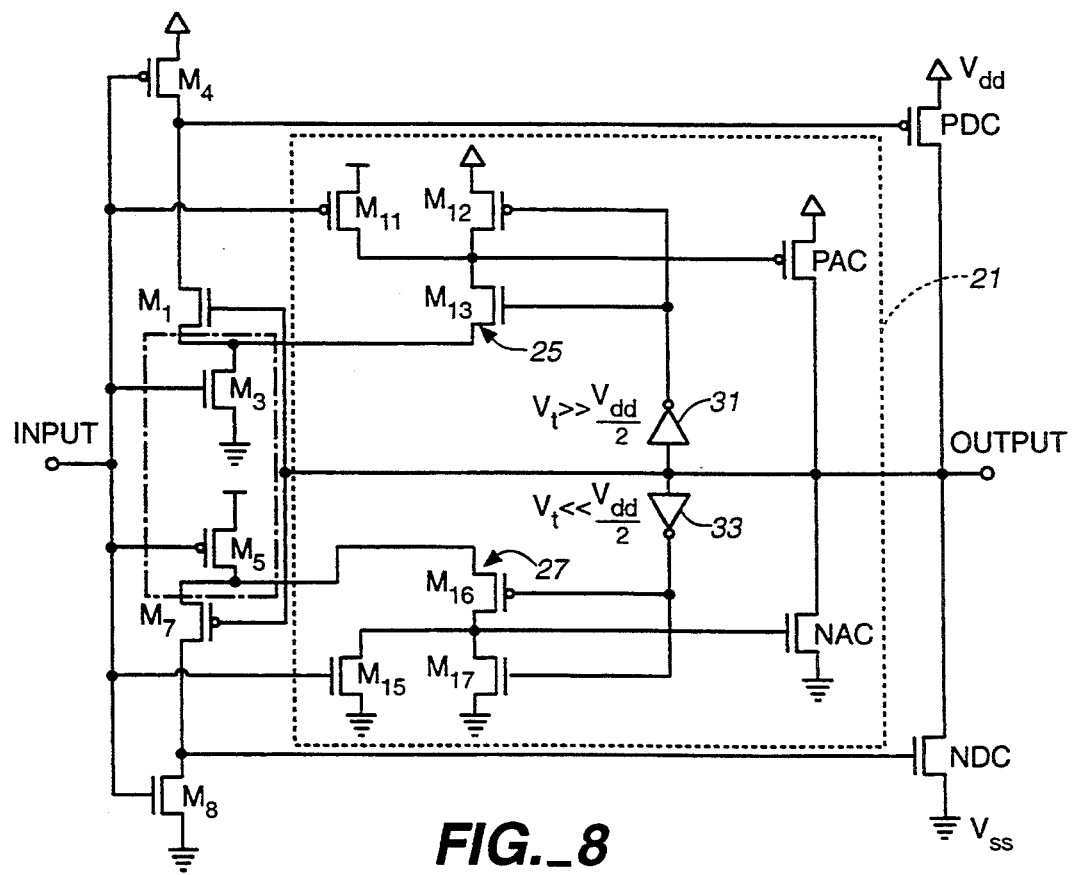
FIG. 8 is a schematic diagram of an embodiment of the I/O buffer circuit of the present invention.

Although the DC and AC sections are shown in FIGS. 3 and 4 as being separated, in a preferred embodiment, the DC and AC sections are not actually separated. Referring to FIG. 8, the portion of the circuit inside in the dashed box corresponds to the AC driver 21 and the portion of the circuit outside the dashed box corresponds to the DC driver 23. In the AC driver, transistors M11, M12, M13 and M3 correspond to the NAND gate 25 and transistors M15, M16, M17 and M5 correspond to the NOR gate 27. The transistor M3 and M5 are utilized in both the DC and AC sections.

As previously described in relation to FIG. 2, in order to achieve noise isolation, the present I/O buffer uses separate buses for AC power and DC power so as to minimize the voltage spikes seen at the output of a static circuit. Accordingly, in the noise isolated I/O buffer of FIG. 9, the DC driver transistor are connected to DC power and ground, respectively, and the AC driver transistors are connected to AC power and ground. The substrates of all of the transistors however, are connected to DC ground, i.e., "quiet" ground. The circuit of FIG. 9 also includes output enable circuitry so as to allow the I/O buffer to be connected to the same output terminal as one or more other I/O buffers. For each of the driver transistors (PDC, NDC, PAC, NAC), a disabling transistor (PDCoe, NDCoe, PACoe, NACoe) is connected to the gate electrode and controlled by the true or complement form of an output enable signal oen so as to place the driver transistors in the high impedance off state when the output enable signal (or tri-state signal) is active. In addition, two disabling transistors M3oe and M5oe are associated with transistor M3 and M5, respectively, to prevent the driver transistors from being activated through transistors M3 and M5.

Using bus separation as in FIG. 9, ground bounce transmitted through a "static" buffer is dramatically reduced as shown in FIGS. 10A and 10B. Sixteen simultaneously switching outputs having a load capacitance of 98 pF were switched from high to low. The circuit used three AC power pins and one DC power pin, each pin exhibiting an inductance of about 15 Nh. Results obtained using the noise-isolated I/O buffer of Figure are labelled "A", and comparable results obtained using a conventional buffer are labelled "B". As seen in FIG. 10A, the switched output waveform produced by the circuit of FIG. 9 exhibited substantially less ringing than a conventional I/O buffer with similar transient characteristics. This reduction in output ringing during switching is obtained because the output resistance $R_{out}$ of the I/O buffer is usually increased after switching when the AC section turns off. As seen in FIG. 10B, voltage spike transmitted to the output of a static circuit was greatly reduced using the circuit of FIG. 9 as compared to a conventional design. For a conventional design, ground bounce causes the output of the static circuit to ring, the transmitted voltage spike having an initial magnitude of about 3 volts and gradually dying out thereafter. Using the circuit of FIG. 9, the transmitted voltage spike does not exceed one volt, avoiding the erroneous logic transitions that would otherwise be caused using the conventional design.

Although for quietest operation the provision of separate AC and DC power and ground networks (power bus separation) as shown in FIG. 9 is preferred, the circuit of FIG. 8 may still be employed to advantage without bus separation. The use of separate AC and DC sections (without bus separation) is still effective to reduce Di/dt by providing for smaller current surges at different times as compared to a single large current surge in the case of conventional I/O drivers.

Referring to FIG. 11, in another embodiment of the noise-isolated I/O buffer of the present invention, an AC driver section includes transistors T15 and T39 (counterparts of PAC and NAC in the circuit of FIG. 9), transistors T10, T1, T27 and T28, and a transmission gate tgate3. A DC driver section includes transistors T20 and T39 (counterparts of PDC and NDC), transistors T9, T40, T26 and T41, and a transmission gate tgate2. Common to both the AC and DC sections are the combination 52 of a schmitt-trigger inverter and an EXCLUSIVE-NOR gate, and an inverter inv3. The AC and DC sections are of substantially the same configuration. Enable circuitry is provided including transistors T14, T29 and T2, an inverter inv4, and transmission gates tgate1 and tgate 4.

The circuit is enabled when the input EN is logic 0, in which case transmission gates tgate 1 and tgate4 are on and transistors T14 and T29 are off.

The XNOR-schmitt combination 52 receives as inputs both the input signal and the output signal and determines whether they are the same (indicating static operation) or different (indicating a transition situation). If the input and output signals are the same, the XNOR-schmitt combination outputs a logic 1, turning transmission gate tgate3 (and hence the AC section) off, and turning transmission gate tgate2 (and hence the DC section) on. Depending on the input signal, either transistor T9 or transistor T26 will be turned on and the other will be turned off, turning one of the corresponding driver transistors T20 and T39 off and the other on.

When the input signal changes such that the input and output signals are no longer the same, transistors T40 and T41 turn on, disabling the DC section. Transmission gate tgate2 (DC section) is turned off, and transmission gate tgate3 (AC section) is turned on. Depending on the input signal, either transistor T10 or transistor T27 will be turned on and the other will be turned off, turning one of the corresponding driver transistors T15 and T39 off and the other on. When switching is done, transistors T1 and T28 disable the AC section, and the circuit enters static operation in the opposite state as before.

Another embodiment of the noise-isolated buffer of the present invention is shown in FIG. 12. Transistors U1 through U6 makeup the AC driver (the transient switching circuit). Transistors U7 through U14 makeup the DC driver (the logic holding circuit). Of the foregoing, transistors U2 and U5 connect to the Ac power supply. All other power connections, including substrates of U2 and U5, are to the DC power supply.

Transistors U3 and U4 feed back the pad voltage to the AC driver so that it shuts off as the pad voltage approaches the level it is switching to.

Transistors U10 and U11 are optional but may be used to prevent the DC section from turning on until the output voltage has begun to change. The goal of having the DC driver turn on slowly or after the output has almost reached the desired voltage can also be accomplished by making U9 and U12 the appropriate sizes. The higher the resistance of U9 and U12 the slower the DC driver turns on and the less noise it generates, although at the expense of slowing the pad down somewhat.

As compared with the circuit of FIG. 9, which is presently preferred, the DC driver in the circuit of FIG. 12 must be turned on sooner, because the AC driver begins to turn itself off very quickly, as soon as the output starts to change. The DC driver has to finish switching the output. In the preferred circuit the AC driver can switch the output all by itself. In the circuit of FIG. 12, on the other hand, the AC driver may require some help to finish switching the output unless the load is very small, because it will shut itself off. Turning the DC driver on earlier generates more noise than in the preferred circuit of FIG. 9. The circuit of FIG. 12 has the advantage that it does not oscillate after it switches if the DC driver is made relatively small.

The foregoing has described the principles, preferred embodiments and modes of operation of the present invention. However, the invention should not be construed as limited to the particular embodiments discussed. Instead, the above described embodiments should be regarded as illustrative rather than restrictive and it should be appreciated that variations may be made in the embodiments by workers skilled in the art without departing from the scope of the present invention as defined by the following claims.

What is claimed is:

1. A noise-isolated I/O buffer, comprising:
an output terminal;
transient switching circuit means comprising four transistors connected in series between power and ground voltage sources to form first, second and third circuit nodes, gate terminals of each of the four transistors being connected to a logic input signal, a first output driver transistor connected to a first driver control signal produced at said first circuit node, and a second output driver transistor connected to a second driver control signal produced at said third circuit node, said second circuit node being connected to said output terminal for causing a logic level of said output terminal to be switched responsive to a change in said input signal;
logic holding circuit means connected to said logic input signal and to said output terminal, for causing the logic level of the output terminal to be maintained in the absence of a change in said input signal;
wherein said transient switching circuit means is turned off in the absence of a change in said input signal, and said logic holding circuit means is turned off responsive to a change in said input signal.

2. A noise-isolated I/O buffer, comprising:
an output terminal;
transient switching circuit means connected to power and ground voltage sources, to a logic input signal, and to said output terminal, and comprising a pair of output driver transistors connected to said output terminal, a logic NAND gate, a logic NOR gate, a first inverter having a first logic threshold, and a second inverter having a second logic threshold, said first and second inverters each receiving as an input signal an output signal produced at said output terminal, said logic NAND and logic NOR gates each receiving as input signals said logic input signal and an output signal produced by a respective one of said first and second inverters, and each producing an output signal to control said pair of output driver transistors, for causing a logic level of said output terminal to be switched responsive to a change in said input signal;
logic holding circuit means connected to power and ground voltage sources, to said logic input signal, and to said output terminal, for causing the logic level of the output terminal to be maintained in the absence of a change in said input signal;
wherein said transient switching circuit means is turned off in the absence of a change in said input signal, and said logic holding circuit means is turned off responsive to a change in said input signal.

3. The apparatus of claim 2, wherein said logic holding circuit comprises a pair of holding output driver transistors connected to said output terminal, a first pair of input transistors connected so as to input a logic low signal to one of the pair of holding output driver transistors when both the input signal and the output signal are logic high, and a second pair of input transistors connected so as to input a logic high signal to the other one of the pair of holding output driver transistors when both the input signal and the output signal are logic low.

4. The apparatus of claim 3, further comprising output enable means connected to said transient switching circuit means and said logic holding circuit means for causing said output terminal to be placed in a high-impedance condition responsive to a predetermined logic level of an output enable signal.

* * * * *